United States Patent [19]

Iwasa

[11] Patent Number: 5,686,746

[45] Date of Patent: Nov. 11, 1997

[54] SEMICONDUCTOR MEMORY DEVICE AND A METHOD OF MAKING THE SAME

[75] Inventor: Shoichi Iwasa, Tokyo, Japan

[73] Assignee: Nippon Steel Corporation, Tokyo, Japan

[21] Appl. No.: 521,445

[22] Filed: Aug. 30, 1995

[30] Foreign Application Priority Data

Mar. 31, 1994 [JP] Japan ................................. 6-230360
Aug. 31, 1994 [JP] Japan ................................. 6-230359

[51] Int. Cl.$^6$ ................................................ H01L 27/108
[52] U.S. Cl. .......................... 257/296; 257/630; 257/659
[58] Field of Search ................................. 257/296, 306, 257/503, 630, 758, 659

[56] References Cited

PUBLICATIONS

M. Sakao et al., A Capacitor–Over–Bit–Line (COB) Cell With A Hemispherical–Grain Storage Node For 64Mb DRAMS, IEDM, IEEE, 1990 pp. 655–658, Dec. 1990.

*Primary Examiner*—Mark V. Prenty
*Attorney, Agent, or Firm*—Pollock, Vande Sande & Priddy

[57] ABSTRACT

A semiconductor memory device comprises a field shield element isolation structure defining a plurality of electrically isolated element regions and a plurality of memory cells in a matrix of rows and columns, each including a transistor having two impurity diffusion layers, a gate electrode and a capacitor. A plurality of bit lines extends in a row direction and a plurality of word lines in a column direction. A memory cell pair is formed in each of the element regions and includes two adjacent memory cells disposed in the row direction. Each of the transistors of the two memory cells in each pair has two impurity diffusion layers, one of which is common to both transistors and connected to one of the bit lines extending in the row direction immediately thereabove through a first pad polycrystalline silicon film. A second pad is formed on the other impurity diffusion layer of each transistor to extend over a portion of the element isolation structure and adjacent thereto in the column direction. A lower electrode of a capacitor of memory cell in each pair is formed on and insulated from the bit line connected to the common impurity diffusion layer of the respective transistors and to the other impurity diffusion layer through one of the second pad polycrysatalline films.

7 Claims, 18 Drawing Sheets

FIG. IIA
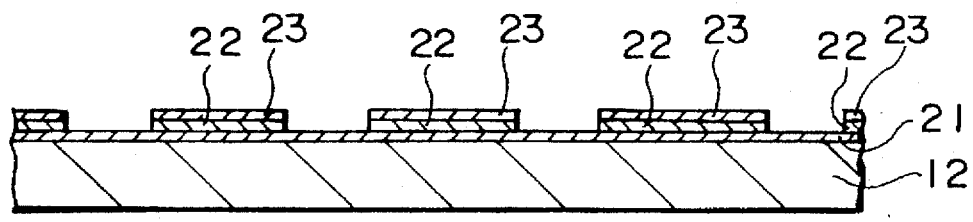
FIG. IIB
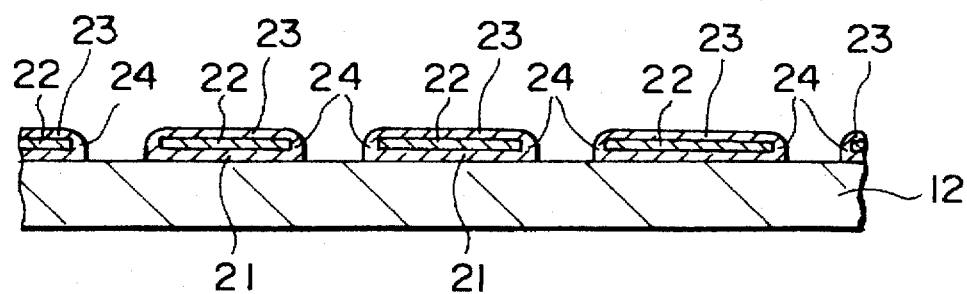
FIG. IIC
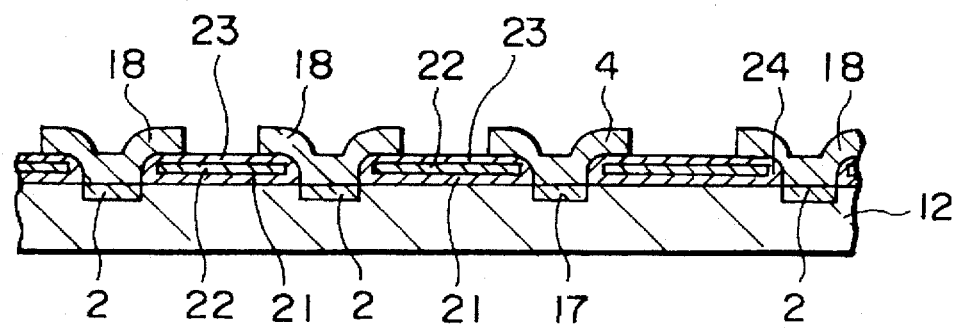

SEMICONDUCTOR MEMORY DEVICE AND A METHOD OF MAKING THE SAME

BACKGROUND OF THE INVENTION

1. Field of the Invention

This invention relates to a semiconductor memory device and a method of making the same. More particularly, this invention relates to a semiconductor memory device having a stacked cell structure wherein element regions are isolated by a field shield element isolation structure, and a method of making the same.

2. Description of the Related Art

Prior art DRAMs having a stacked cell structure have widely employed a cell layout shown in FIG. 12 which conforms with a folded bit line system capable of offsetting noises between bit lines.

This conventional DRAM will be explained with reference to FIGS. 12 through 14. Incidentally, the element isolation in this example is effected by a field shield element isolation system.

FIG. 12 is a schematic plan view showing layout of the DRAM, FIG. 13 is a sectional view taken along a line XIII—XIII of FIG. 12, and FIG. 14 is a sectional view taken along a line XIV—XIV of FIG. 12.

As shown in FIGS. 12 through 14, a field shield element isolation structure 101 is formed on a P-type silicon substrate 112, and gate electrode wirings 103 of memory cells that constitute word lines and gate electrodes 110 of peripheral transistors are formed in the element regions isolated by this field shield element isolation structure 101 by gate oxide films 113, respectively. Drain and source diffusion layers 102 and 119 are so formed as to interpose the gate electrode wiring 103 between them and pad polycrystalline silicon films 104 and 118, which have been used as impurity diffusion sources of the drain and source diffusion layers 102, 119, are formed on their surfaces, respectively.

As shown in FIGS. 13 and 14, the drain diffusion layer 102 of each memory cell is connected to a storage electrode 106 through the pad polycrystalline silicon film 104 and a storage contact 105, and a capacitor insulating film 111 and a cell plate electrode 109 are formed successively on the storage electrode 106.

On the other hand, the source diffusion layer 119 is common to two gate electrode wirings 103 or two memory cells, as shown in FIG. 13, and is connected to a bit line 108 formed above a cell plate electrode 109 through the pad polycrystalline silicon film 118 and a bit contact 107.

As shown in FIG. 12, the bit contacts 107 are disposed at every other bit lines 108 in a direction extending along the word line 103 (the direction indicated by an arrow A) and are disposed at an interval corresponding to four word lines 103 in the direction extending along the bit line 108 (the direction indicated by an arrow B).

The storage contacts 105 are aligned in the direction of the word line 103 in accordance with this arrangement of the bit contacts 107 as shown in FIGS. 12 and 14. In the direction of the bit line 108, on the other hand, there are disposed the bit contacts 107, the storage contacts 105, the field shield element isolation structures 101 and the adjacent storage contacts 105 in that order.

According to this construction, the space for increasing the cell capacity by expanding the surface area of the storage electrode 106 formed immediately above the storage contact 105 no longer exists substantially.

Therefore, the height of the storage electrode 106 has been increased in recent years in order to secure a sufficient cell capacitance in accordance with shrinkage of the cell size. As a result, an aspect ratio of the bit contact 107 becomes greater as shown in FIG. 13, and it has become difficult to form a wiring of aluminum or the like by a conventional sputtering process. Therefore, a polycide structure which is stable for process such as thermal treatment has been used for the bit line 108 in place of the aluminum wiring.

Particularly when the field shield element isolation system is used, the height of the element isolation region becomes more than double in comparison with a conventional LOCOS process, and the use of the polycide structure for the bit line 108 becomes essential.

In the prior art cell layout described above, there is no way but to increase the height of the storage electrode 106 in order to secure a sufficient cell capacitance. As a result, the aspect ratio of the bit contact 107 becomes great, and a buried plug technology using a polycide wiring, polycrystalline silicon or tungsten has been employed so as to secure connection reliability.

However, only an N type impurity can be doped to a polycrystalline silicon layer used for the polycide wiring and for this reason, the polycide wiring can be applied only to the wiring connected to only the bit contact 107 and peripheral N-type conductive layers.

Further, the buried plug using polycrystalline silicon can be applied only to the bit contact 107 and the peripheral N type conductive layers.

In the case of the buried plug using tungsten which can be connected to conductive layers of both conductivity types, on the other hand, TiN (titanium nitride), which is used as a barrier metal and a glue layer CVD-tungsten as formed by CVD, is formed by sputtering. Therefore, connection reliability is low in the contact having a high aspect ratio.

In order to reduce as much as possible the aspect ratio of the peripheral contacts 120, the existing process forms a step at a boundary portion between a cell array portion and a peripheral portion by using BPSG (Boro-Phospho Silicate Glass) reflow thereby to reduce the thickness of an inter layer insulating film 115 of the peripheral portion.

However, as the cell size has been reduced more and more in recent years, the height of the storage electrode 106 has become much higher and the step at the boundary between the cell array portion and the peripheral portion becomes much greater. On the other hand, the margin of depth of focus, at which a very small size can be precisely focused in photolithography, has become smaller for the bit line 108 disposed in each cell pitch. As a result, the problem that the bit line 108 extending from the cell array portion to the peripheral portion has a reduced accuracy in dimension due to poor resolution at the step between them has become serious in practice.

SUMMARY OF THE INVENTION

It is an object of the present invention to provide a semiconductor memory device which can reduce the affect of a step between a cell array portion and a peripheral portion on dimensional accuracy of bit lines and increase a memory cell capacitance much more than the prior art device, and a method of making the same.

According to one aspect of the present invention, there is provided a semiconductor memory device which comprises a field shield element isolation structure for defining a plurality of element regions electrically isolated from one another; a plurality of memory cells disposed in a matrix of rows and columns, each including a transistor having two impurity diffusion layers and a gate electrode and a capacitor; a plurality of bit lines extending in a row direction; a plurality of word lines extending in a column direction; a plurality of memory cell pairs, each of the pairs being formed in one of the plurality of element regions and including adjacent two of the memory cells disposed in the row direction, each of the transistors of the two memory cells constituting the memory cell pair having two impurity diffusion layers, one of which is common to both the transistors and connected to one of the bit lines disposed immediately above the one impurity diffusion layer and extending in the row direction through a first pad polycrystalline silicon film; a second pad polycrystalline silicon film formed on the other impurity diffusion layer of each of the transistors of the memory cells constituting each memory cell pair and extending over a portion of the element isolation structure defining one of the element regions in which the memory cell pair is formed and adjacent in the column direction to the one element region; and a lower electrode of the capacitor of each of the memory cells constituting each memory cell pair formed on and insulated from the one bit line to which the one impurity diffusion layer is connected and connected to the other impurity diffusion layer through the second pad polycrystalline silicon film.

The present invention provides also a method of making the semiconductor memory device having the construction described above.

According to another aspect of the present invention, there is also provided a semiconductor memory device which comprises a field shield element isolation structure for defining a plurality of element regions electrically isolated from one another; a plurality of memory cells disposed in a matrix of rows and columns, each memory cell including a transistor having two impurity diffusion layers and a capacitor; a plurality of bit lines extending in a row direction; a plurality of word lines extending in a column direction; a plurality of memory cell pairs, each memory cell pair being formed in one of the plurality of element regions and including adjacent two of the memory cells disposed in the row direction, each of the transistors constituting each memory cell pair including two impurity diffusion layers, wherein one of said two impurity diffusion layers is common to both the transistors and connected to one of the bit lines extending over said one impurity diffusion layer in the row direction through a first pad polycrystalline silicon film and the other of said two diffusion layers is formed at a position deviated in the column direction with respect to said one bit line extending over said one impurity diffusion layer so that said other impurity diffusion layer is positioned immediately below a gap between adjacent two of said bit lines; and a lower electrode of the capacitor of each of the memory cells constituting each memory cell pair formed on and insulated from said one bit line to which the one impurity diffusion layer common to the transistors of said memory cell pair is connected and connected to the other impurity diffusion layer of the transistor of the memory cell through a second pad polycrystalline silicon film.

The present invention further provides a method of making the semiconductor memory device having the construction described above.

In the first aspect of the present invention, the bit line is formed at a position below the storage electrode serving as the capacitor lower electrode by making a storage contact on a portion of the field shield element isolation structure disposed between the bit lines. Accordingly, no step exists in the bit line at a portion thereof between the cell array portion and the peripheral portion, and the unresolution problem does not occur in the bit line. Further, since the bit line is formed at a portion lower than the storage electrode, the surface area of the storage electrodes can be enlarged much more than in the prior art devices without being impeded by the bit contact. Further, the cell capacitance can be increased by increasing the height of the storage electrode without being restricted by the problem of the step of the bit line, and a three-dimensional structure such as a fin type can be employed for the capacitor structure.

In the method of the present invention, the pad polycrystalline silicon film, which is used as a source for diffusion of impurity, is utilized for the storage contact made on the field shield element isolation structure.

In another aspect of the present invention, the bit line is formed below the storage electrode serving as the capacitor lower electrode by deviating, with respect to one of the impurity diffusion layers (for example, a source) of each memory cell disposed just below a bit line to which the one impurity diffusion layer is connected, the other impurity diffusion layer (for example, a drain) in the direction of the word line so as to locate the other impurity diffusion layer just below a gap between two bit lines so that the storage contact can be formed between the two bit lines. Therefore, no step exists in the bit line at a portion between the cell array portion and the peripheral portion so that the bit line is free from the unresolution problem. Also, since the bit line is formed below the storage electrode, the surface area of the storage electrode can be made larger without being restricted by the bit contact as compared with the prior art. Further, since it is unnecessary to consider the problem due to the step of the bit line, the height of the storage electrode can be readily made higher thereby increasing the cell capacitance and also the three-dimensional structure such as a fin type can be used for the capacitor.

A so-called "COB (Capacitor Over Bit-line) structure", wherein the storage electrode is formed in an upper layer than the bit line, is known, for example, from "A Capacitor-Over-Bit-line (COB) Cell with A Hemispherical-Grain Storage Node For 64 Mb DRAMs", M. Sakao et al, IEDM 1990, p.p. 655–658.

BRIEF DESCRIPTION OF THE DRAWINGS

FIGS. 11A to 11H are sectional views corresponding to FIG. 8 at the respective steps in a method of making a DRAM according to the second embodiment of the present invention;

DESCRIPTION OF THE PREFERRED EMBODIMENTS

The structure of a DRAM according to the first embodiment of the present invention will be explained with reference to FIGS. 1 through 5.

Figure 1:
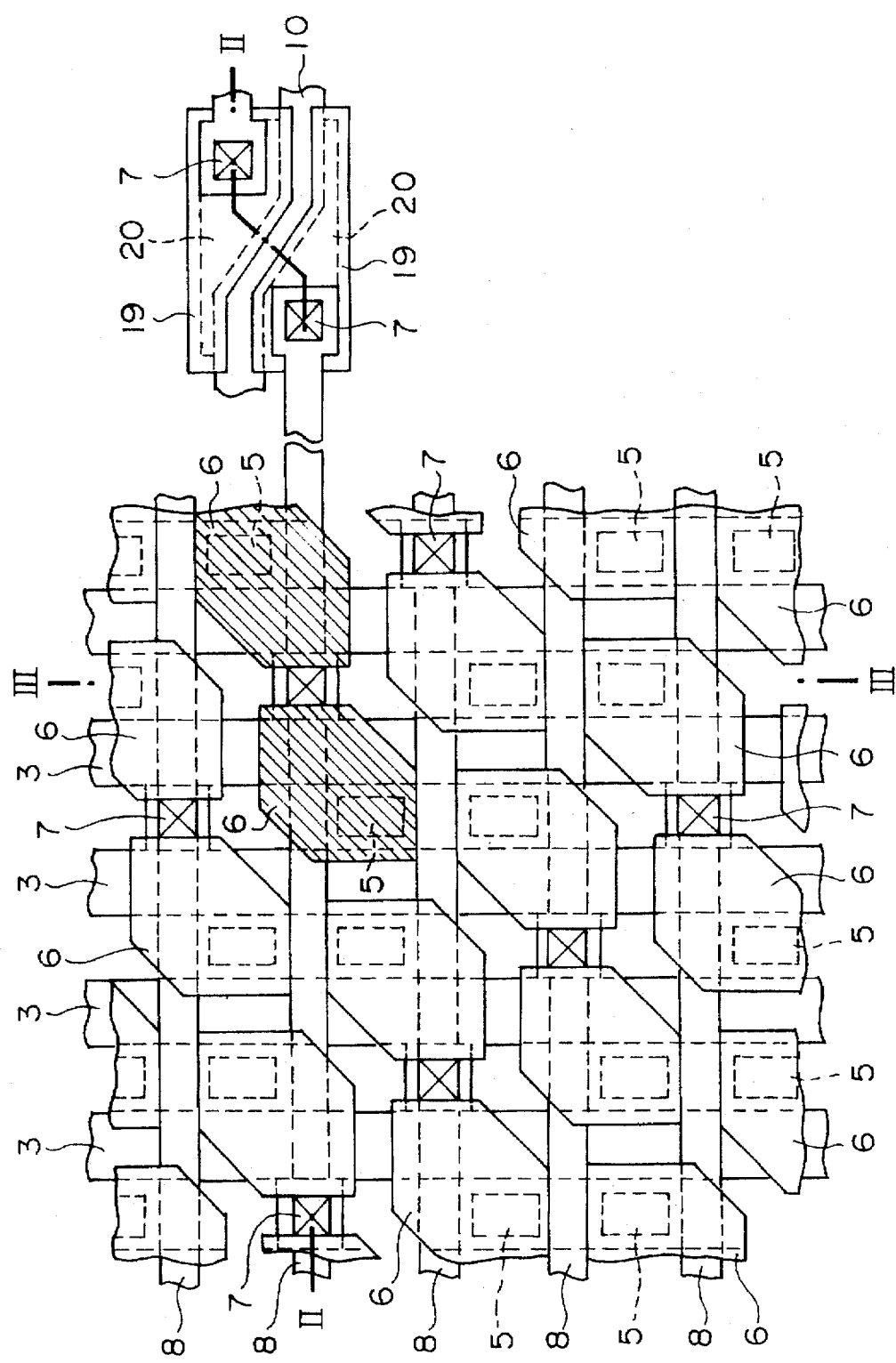
FIG. 1 is a plan view showing the structure of a DRAM according to the first embodiment of the present invention.

As shown in FIG. 1, the DRAM includes a plurality of memory cells disposed in a matrix of rows and columns and a group of transistors disposed around the periphery of the memory cells for controlling the latter. As is well known, each memory cell includes an access transistor and a capacitor. Each transistor has two impurity diffusion layers and a gate electrode, wherein one of the impurity diffusion layers is connected to one of a plurality of bit lines extending in the row direction, the other impurity diffusion layer is connected to one of the electrodes of the capacitor and the gate electrode is connected to one of a plurality of word lines extending in the column direction.

Figure 2:
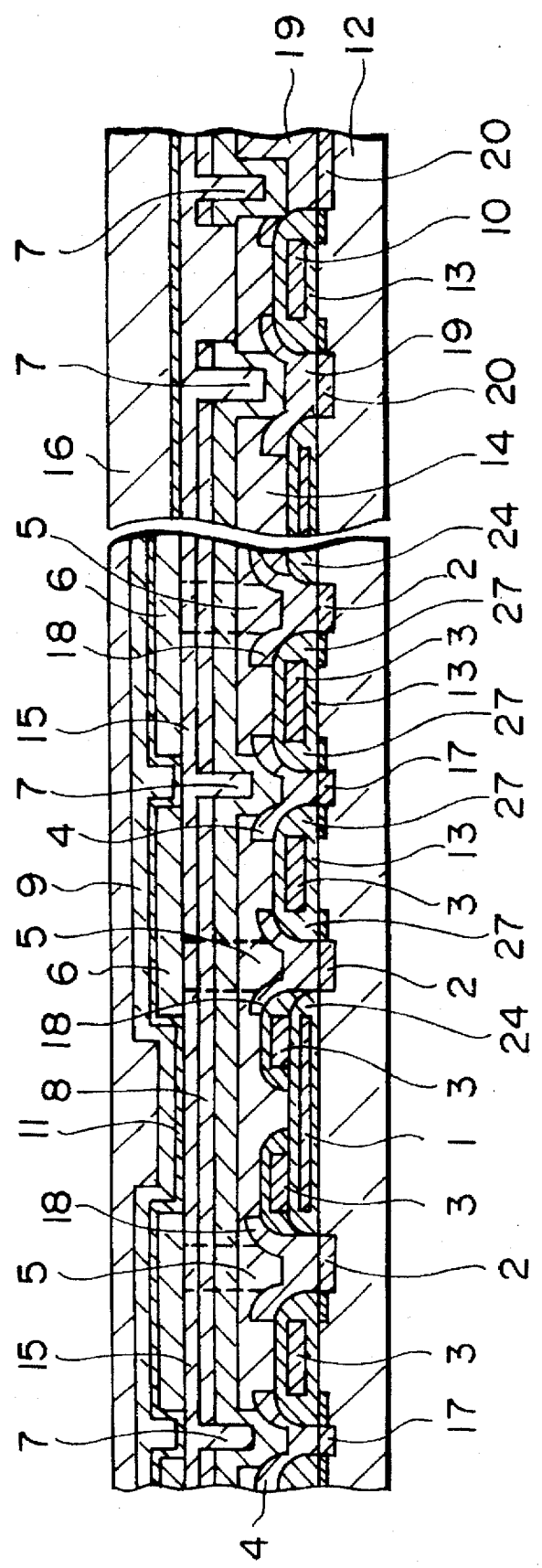
FIG. 2 is a sectional view taken along a line II—II of FIG. 1.

A field shield element isolation structure 1 is formed on a P-type silicon substrate 12 as shown in FIG. 2, and a gate electrode wiring of a memory cell serving as a word line 3 and a gate electrode 10 of a peripheral transistor are formed in the element regions isolated each other by the field shield element isolation structure 1 with interposed gate oxide films 13, respectively. An N-type drain diffusion layer 2 and an N-type source diffusion layer 17 are formed in each memory cell region so as to have the word line 3 disposed between them, thereby forming an access transistor of the memory cell. N-type source/drain diffusion layers 20 of the peripheral transistor are formed in the peripheral transistor region so as to have the gate electrode 10 disposed between them.

Figure 3:
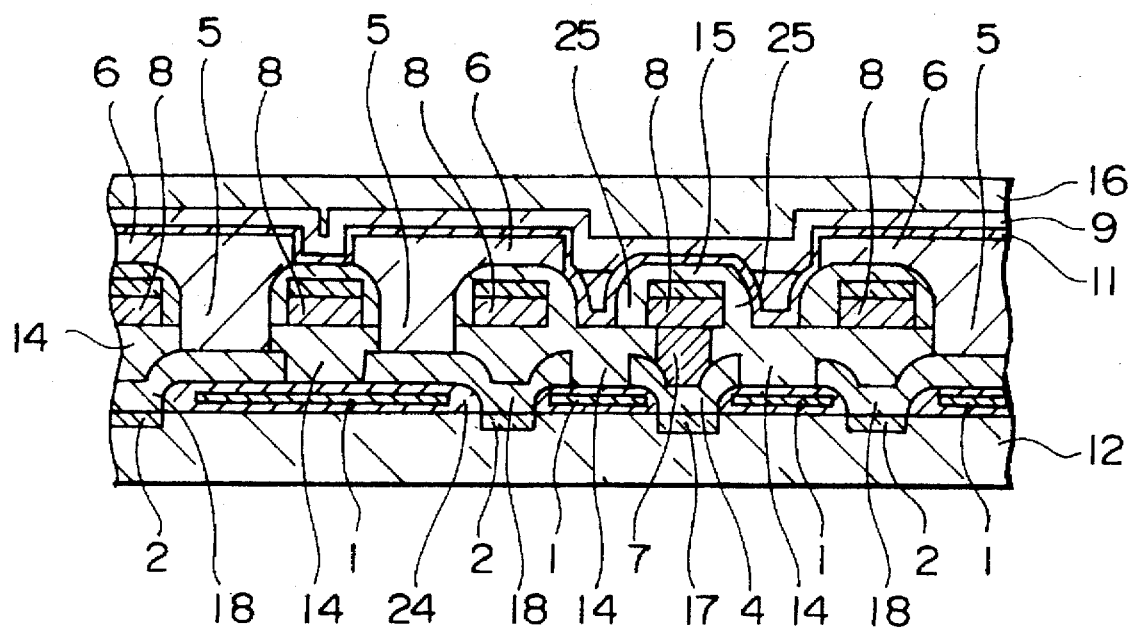
FIG. 3 is a sectional view taken along a line III—III of FIG. 1.
Figure 4:
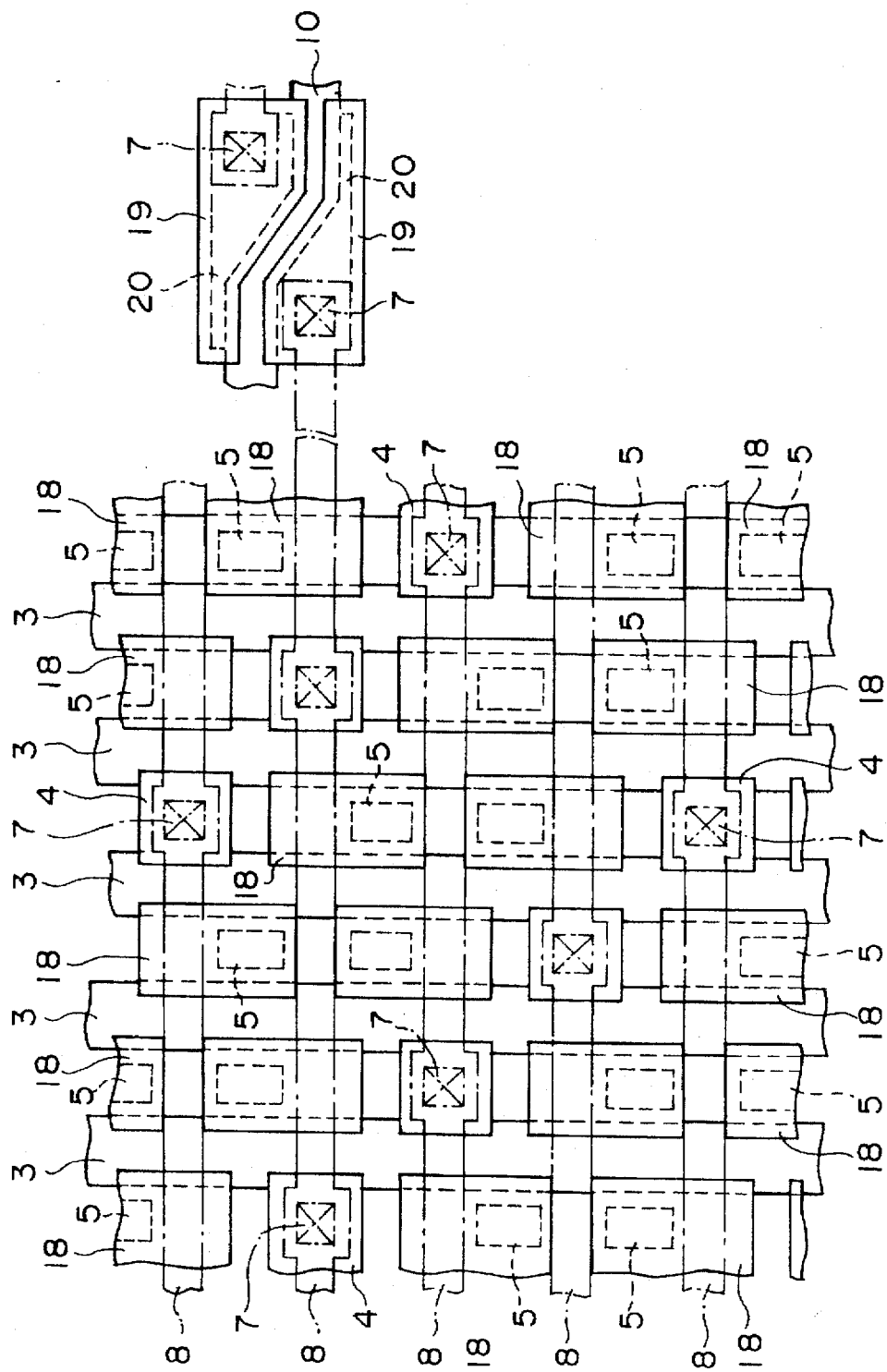
FIG. 4 is a plan view showing particularly clearly the arrangement of a pad polycrystalline silicon film in the embodiment shown in FIG. 1.

As shown in FIGS. 2 through 4, pad polycrystalline silicon films 18, 4 and 19 are formed on the drain diffusion layer 2 and the source diffusion layer 17 of each memory cell and on the source/drain diffusion layers 20 of the peripheral transistor, respectively. These polycrystalline silicon films 18, 4 and 19 are used as impurity diffusion sources for the diffusion layers 2, 17 and 20, and are in direct contact with the P-type silicon substrate 12 through an opening defined by an AC sidewall 24 of the field shield element isolation structure facing an active region and the sidewall 27 of the word line 3.

Each source diffusion layer 17 is common, as shown in FIG. 2, to the Gate electrodes of adjacent two access transistors disposed in a direction extending along the bit line 8 and connected to the bit line 8 through the pad polycrystalline silicon film 4 and the bit contact 7. In other words, each source diffusion layer 17 is common to adjacent two memory cells disposed in the direction extending along the bit line 8 and these memory cells constitute a memory cell pair (as shown by hatching FIG. 1) using a common bit contact 7 (see FIG. 5). Each memory cell pair is formed in one of the element regions defined by the element isolation structure described above.

As shown in FIGS. 1 and 2, the bit line 8 is extended outside the cell array region and connected to the source/drain diffusion layer 20 of the peripheral transistor constituting a column decoder or the like. The bit line 8 is formed in a layer lower than a storage electrode 6 of each memory cell, i.e. in a COB (capacitor over bit-line) structure. Therefore, the bit contact 7 of the cell array portion can be formed into the same small depth as the bit contact 7 of the peripheral portion and no step exists in the bit line 8 at its portion between the cell array portion and the peripheral portion. For these reasons, the poor dimensional accuracy of the bit line 8 can be prevented when the bit line 8 is formed.

As shown in FIGS. 2 and 3, the drain diffusion layer 2 of each memory cell is connected to the storage electrode 6, which is formed above the bit line 8, through the pad polycrystalline silicon film 18 and the storage contact 5. A cell plate electrode 9 of a polycrystalline silicon film is formed over the storage electrode 6 with an interposed ONO capacitor insulating film 11 having a three-layer structure of silicon dioxide film/silicon nitride film/silicon dioxide film.

As shown in FIGS. 3 and 4, the pad polycrystalline silicon film 18 formed on each drain diffusion layer 2 is formed so as to extend from an upper portion of each drain diffusion layer 2 to an upper portion of the field shield element isolation structure disposed adjacent thereto in the word line direction, and the storage contact 5 is formed immediately above the field shield element isolation structure 1. Consequently, the storage contact 5 is disposed in a gap region defined between two word lines 3 and also between two bit lines 8, as shown in FIGS. 1 and 4. The pair of pad polycrystalline silicon films 18 of each memory cell pair are formed to extend in mutually opposite directions along the word line 3 with respect to a line connecting the drain regions of the pair of the memory cells. In this way, the memory cell pairs can be densely arranged with each pair being arranged in a direction oblique to both of the word line 3 and the bit line 8.

Figure 5:
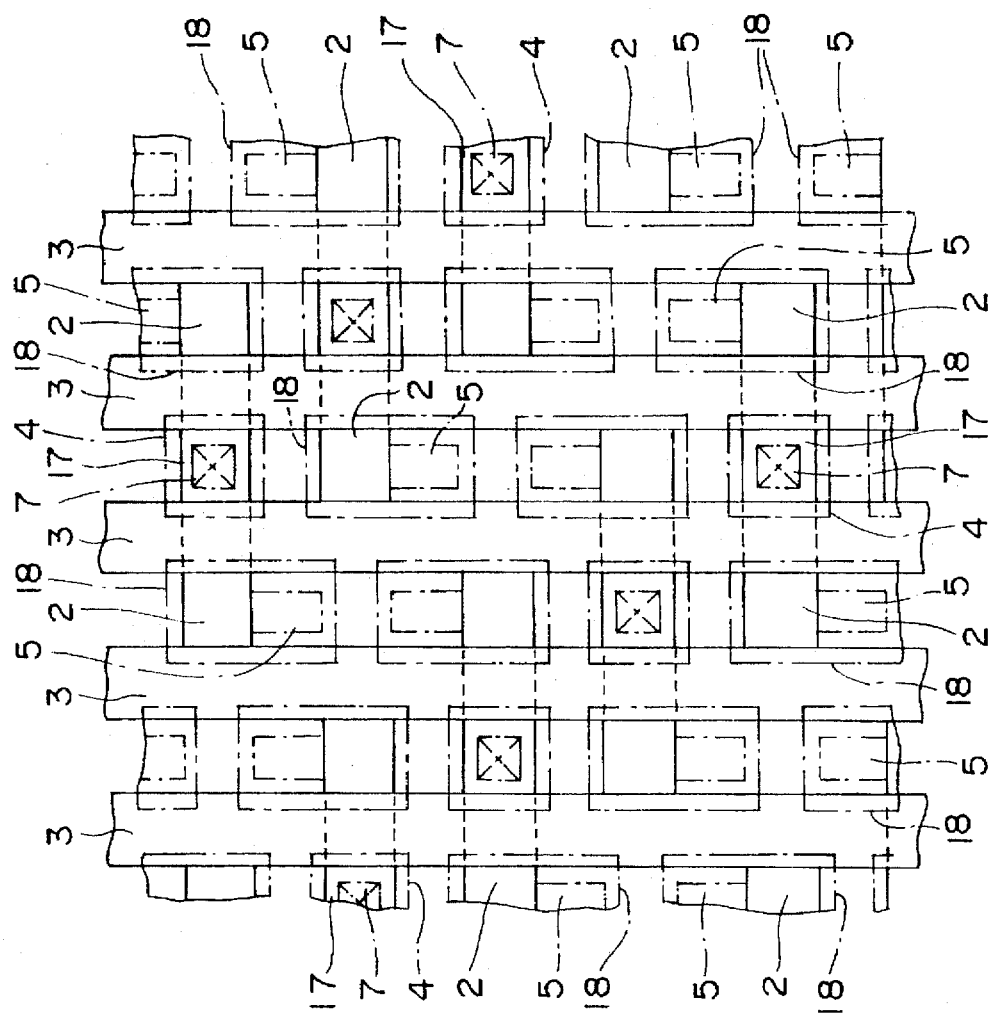
FIG. 5 is a plan view showing particularly distinctly the arrangement of memory cells in the embodiment shown in FIG. 1.

As shown in FIGS. 4 and 5, the pad polycrystalline silicon films 4 are arranged such that two pad polycrystalline silicon films 18 are disposed between adjacent two of the pad polycrystalline silicon films 4 in the direction along the word line 3 and four word lines 3 are disposed between adjacent two of the pad polycrystalline silicon films 4 in the direction along the bit line 8. Consequently, the bit contacts 7 are arranged in the cell array portion, as shown in FIGS. 1 and 4, such that four word lines are disposed between adjacent two of the bit contacts in the direction along the bit line 8 and three bit lines 8 are disposed between adjacent two of the bit contacts in the direction along the word line 3.

According to the structure of this embodiment, the storage electrode 6 of each memory cell can be formed in a layer higher than the bit line 8, i.e. in the so-called "COB structure". Accordingly, the surface area of the storage electrode 6 can be enlarged without being restricted by any of the bit line 8 and the bit contact 7. In other words the GaP between the bit lines 8 can be reduced without decreasing the memory cell capacitance. Accordingly, it is possible to reduce the size of the memory cell array and to make higher its integration density.

The construction of this embodiment is free from the problem that the aspect ratio of the bit contact 7 becomes Great at the cell array portion and the step of the bit line 8 becomes Great at the boundary portion between the cell array portion and the peripheral portion and allows the storage electrode 6 to form into a three-dimensional structure. In other words, the storage electrode 6 can be formed in the three-dimensional structure such as a thick film, a cylindrical shape, a fin type, an irregular plate or the like, thereby increasing the effective area of the capacitor.

Further, since the cell plate electrodes 9 cover the bit line 8, noise between the bit lines can be advantageously eliminated.

Next, a method of making a semiconductor memory device according to the first embodiment will be explained with reference to FIGS. 2 and 6A through 6H. Incidentally, each of FIGS. 6A through 6H is a schematic sectional view corresponding to FIG. 3.

Figure 6A:
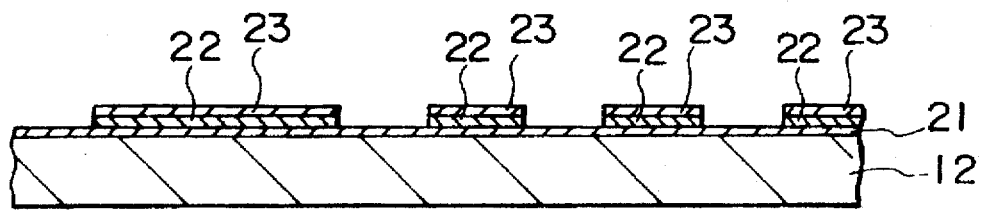
FIGS. 6A to 6H are sectional views corresponding to FIG. 3 at the respective steps in a method of making the DRAM of the first embodiment of the present invention.

First, a pad oxide film 21 having a thickness of 40 to 60 nm is formed on the entire surface of a P-type silicon substrate 12 by a thermal oxidation process as shown in FIG. 6A. A polycrystalline silicon film 22 doped with phosphorus by an LPCVD process, etc., and having a thickness of 150 to 200 nm and a cap oxide film 23 having a thickness of 250 to 300 nm are successively formed on the pad oxide film 21. Next, the polycrystalline silicon film 22 and the cap oxide film 23 are subjected to photolithography and anisotropic etching so as to leave them only at portions where the element isolation region to be formed, thereby forming an element isolation region and element regions.

Figure 6B:
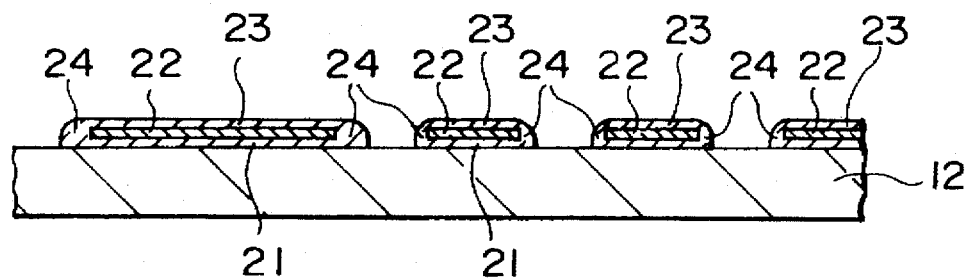

Next, as shown in FIG. 6B, a silicon dioxide film having a thickness of 250 to 300 nm is deposited to the entire surface by the LPCVD process, etc., and is then etched back by anisotropic dry etching so as to form AC sidewalls 24 on the side surfaces 23, facing active regions, of the polycrystalline silicon film 22 and the cap oxide film 23. In this way, the field shield element isolation structure is formed over the silicon substrate 12.

Next, after the Gate oxide film 13 is formed on the silicon substrate 12 in each element region by the thermal oxidation process as shown in FIG. 2, a polycrystalline silicon film and a cap insulating film of a silicon dioxide film are formed on the entire surface by the CVD process, etc., and are then patterned by photolithography and anisotropic dry etching so as to form word lines 3 and the cap insulating films thereof. Next, an N-type impurity such as arsenic is ion-implanted at a low concentration into the silicon substrate 12 using the pattern of the word lines 3 and the field shield element isolation structure as a mask to form an N$^-$ impurity diffusion layer of the LDD structure. Next, a silicon dioxide film is deposited to the entire surface by the LPCVD process, etc., and is etched back by anisotropic dry etching to form sidewalls 27 on the side surfaces of each word line 3. At this time, the gate oxide films 13 disposed between the AC sidewalls 24 of the field shield element isolation structure and also between the AC sidewall 24 and the sidewall 27 of the word line 3 are removed, and the silicon substrate is exposed at these portions.

Figure 6C:
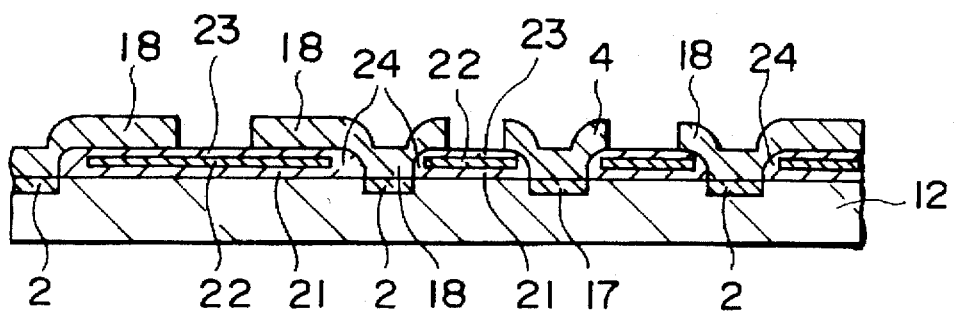

Next, a non-doped polycrystalline silicon film is formed on the entire surface by the CVD process or the like as shown in FIG. 6C. An N-type impurity such as phosphorus is then introduced by ion-implantation. Incidentally, the N-type impurity may be introduced simultaneously with deposition of the polycrystsalline silicon film. Thereafter, this polycrystalline silicon film is patterned into the shape shown in FIG. 4, and pad polycrystalline silicon films 4 and 18 are formed, respectively.

At this time, the pad polycrystalline silicon films 4 and 18 are in direct contact with the silicon substrate through the openings which are formed in self-alignment at portions disposed between the AC sidewalls 24 of the field shield element isolation structure and also between the AC sidewall 24 and the sidewall 27 of the word line 3, as shown in FIGS. 2 and 6C. Further, as shown in FIGS. 4 and 6C, the pad polycrystalline silicon film 18 is formed so as to extend over the cap oxide film 23 of the field shield element isolation structure.

Figure 6D:
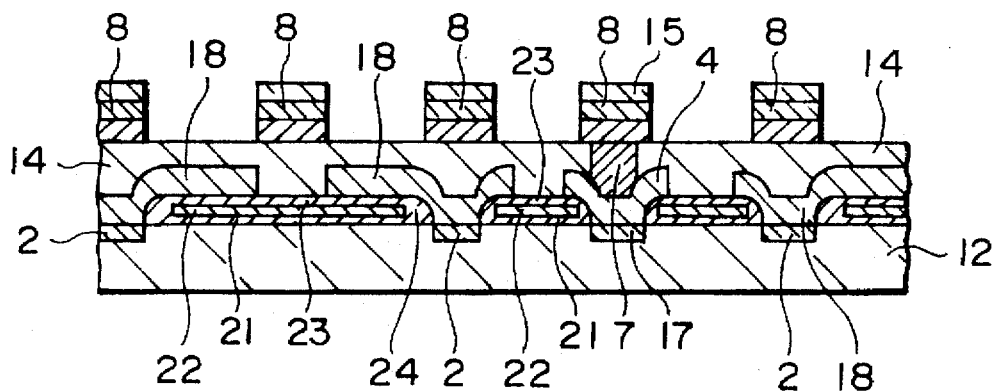

Next, a BPSG film as a first interlayer insulating film 14 is formed on the entire surface by an atomic pressure CVD process, as shown in FIG. 6D. Next, the surface of this BPSG film is planarized by applying thereto thermal treatment at 850° to 900° C. and at the same time, the N-type impurities contained in the pad polycrystalline silicon films 4, 18 are diffused into the silicon substrate 12 through the contact portions, thereby forming N$^+$ impurity diffusion layers of the LDD structure. In this embodiment, the N$^-$ impurity diffusion layers and the N$^+$ impurity diffusion layers of the LDD structure form the drain diffusion layer 2 and the source diffusion layer 17 of each memory cell and the source/drain diffusion layers 20 of the peripheral transistor (see FIG. 2). By the way, when it is not required to form the source/drains of the memory cell and the peripheral transistor into the LDD structure, ion implantation of the N-type impurity at a low concentration into the silicon substrate 12 is omitted and the respective source/drain diffusion layers can be formed by only diffusing the impurity from each of the pad polycrystalline silicon films 4, 18. In such a case, the channel length can be controlled by controlling the diffusion of the impurity in the lateral direction.

Next, the polycrystalline silicon film, into which an impurity is doped, is formed on the entire surface by the CVD process, and tungsten silicide film is then deposited on the entire surface by sputtering or the CVD process. Next, a cap silicon nitride film 15 is formed on the entire surface by the CVD process. These films are then patterned by photo-lithography and anisotropic dry etching so as to form bit lines 8, each having a polycide structure.

Figure 6E:
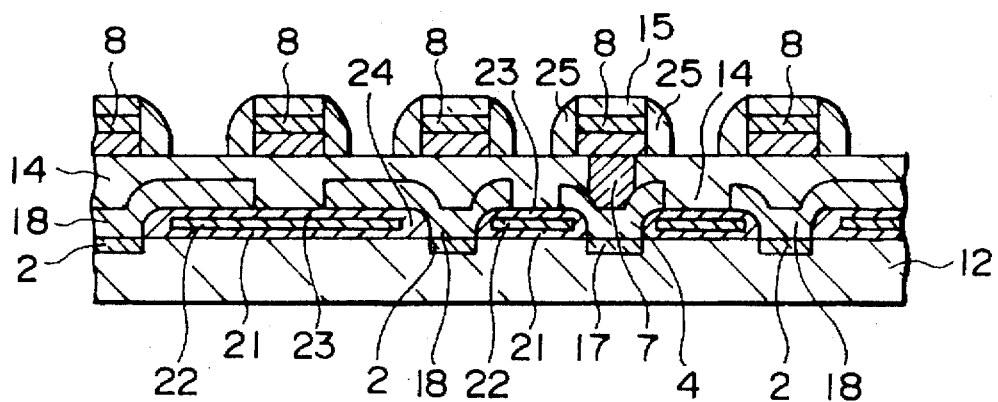

Next, a silicon nitride film is deposited to the entire surface by the CVD process, as shown in FIG. 6E and is etched back to form sidewalls 25 on the side surfaces of the bit line 8.

Figure 6F:
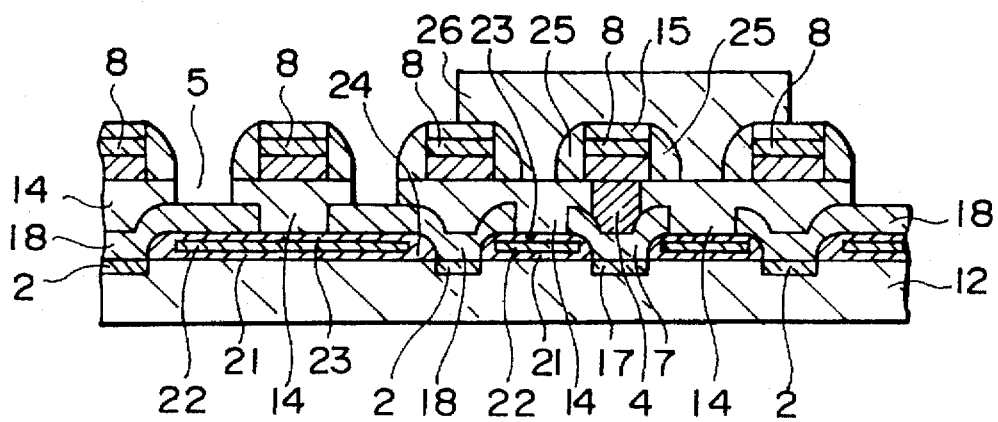

Only a region including the bit contact 7 is next covered with a photoresist 26 as shown in FIG. 6F and wet or dry etching is conducted to form openings through the first interlayer insulating film 14 for the storage contacts 5. At this time, the sidewalls 25 of the bit line 8 as the silicon nitride film functions as an etching mask and the storage contacts 5 are formed in self-alignment with the sidewalls 25.

Figure 6G:
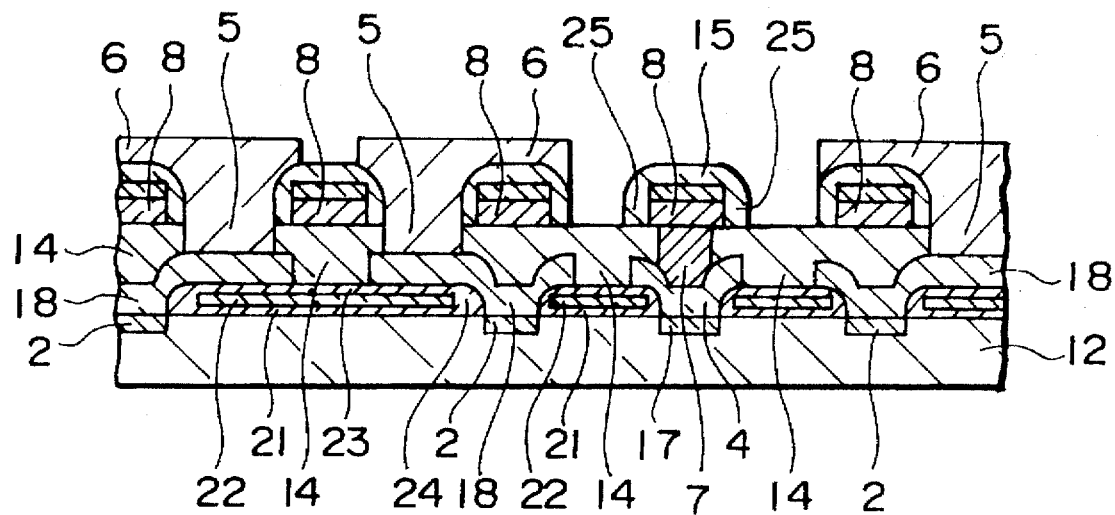

Next, after the photoresist 26 is removed as shown in FIG. 6G, a polycrystalline silicon film doped with an impurity is deposited to the entire surface by the CVD process and is then patterned by photolithography and anisotropic dry etching so as to form the storage electrodes 6.

Figure 6H:
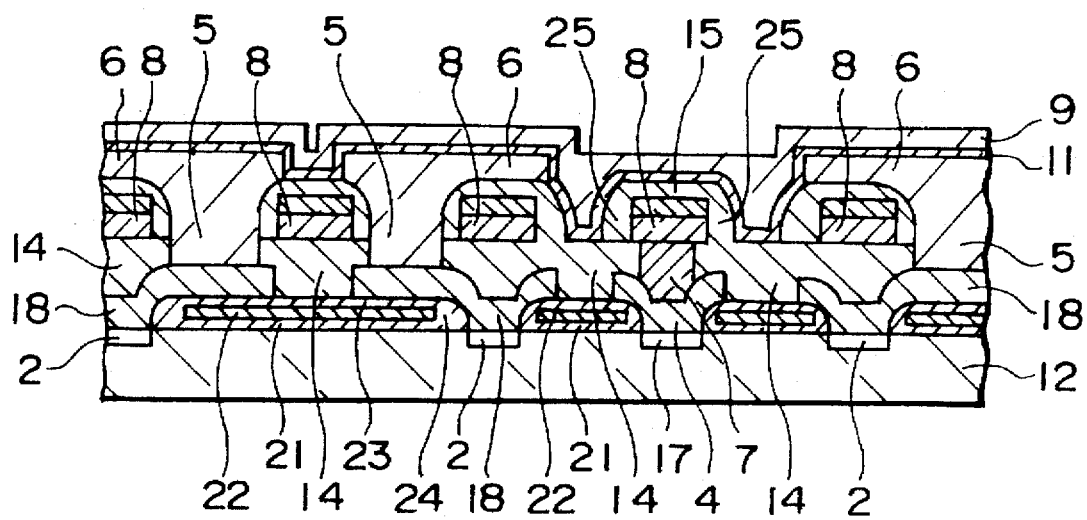

Then, an ONO capacitor insulating film 11 and a cell plate electrode 9 are formed on the entire surface of the cell array portion as shown in FIG. 6H.

Thereafter, a BPSG film is formed as a second interlayer insulating film 16 on the entire surface as shown in FIGS. 2 and 3.

In the method according to this embodiment described above, one of the pad polycrystalline silicon films 18, which is used as the diffusion source of the impurity to the silicon substrate 12, is extended over the field shield element isolation structure 1, so that the storage contact 5 is formed at the position immediately above the field shield element isolation structure 1 and disposed between the bit lines and the storage electrode 6 is formed in a layer higher than the bit line 8.

According to this embodiment, the bit line is formed in a layer lower than the storage electrode and the cell plate electrode of each memory cell. Therefore, even when the cell capacity is increased by increasing the height of the storage electrode or by constituting the storage electrode into a three-dimensional structure, the aspect ratio of the bit contact at the cell array portion does not become great. Furthermore, because no step exists in the bit line at a portion between the cell array portion and the peripheral portion, the poor dimensional accuracy resulting from unresolution of the bit line can be prevented.

This embodiment utilizes the pad polycrystalline silicon film, which is used for a source of impurity to be diffused into the substrate for locating the storage contact of each memory cell at a position between the bit lines, and does not require any other specific components or members.

Next, the structure of a DRAM according to the second embodiment of the present invention will be explained with reference to FIGS. 7 through 10. In these figures, the same reference numerals as in FIGS. 1 through 5 are used to indicate like elements.

Figure 7:
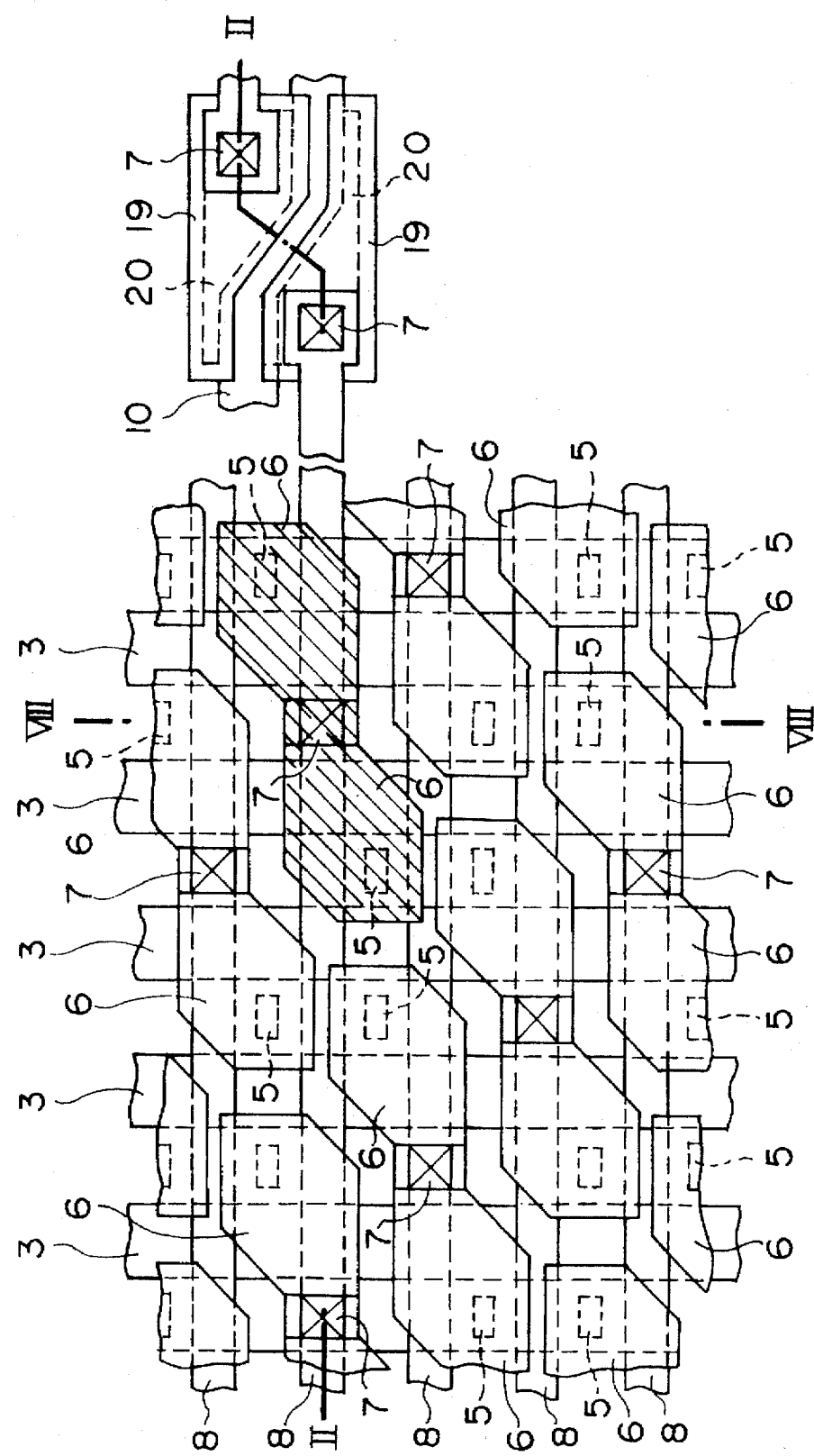
FIG. 7 is a plan view showing the structure of a DRAM according to the second embodiment of the present invention.

FIG. 7 is a plan view showing the structure of the DRAM according to the second embodiment. The sectional view taken along a line II—II of FIG. 7 is the same as that shown in FIG. 2 of the first embodiment. The second embodiment is different from the first embodiment in the relative positional relationship between the drain diffusion layer 2 and the common source diffusion layer 17 in each memory cell pair (shown by hatching in FIG. 7). In other words, as shown in FIGS. 7 through 10, the source diffusion layer 17 of each memory cell pair is formed at a position immediately below the bit line 8 so that it can be connected through the bit contact 7 immediately above the source diffusion layer 17 to the bit line 8 (see FIG. 9) at a position on a line orthogonal to the word line 3 passing through the source diffusion layer 17. On the other hand, each drain diffusion layer 2 is formed at a position deviated in the direction extending along the word line 3 so that the storage contact 5 immediately above it is positioned between the bit lines 8. In the figure, the drain diffusion layer 2 on the left side of the source diffusion layer 17 of each memory cell is deviated somewhat downward, while the drain diffusion layer 2 on the right side is deviated somewhat upward. The shortest distance portion between the drain diffusion layer 2 and the source diffusion layer 17 immediately below the word line 3 provides the channel. In this instance, it is not essential but preferred that the source diffusion layer 17 and the drain diffusion layer 2 somewhat overlap with each other as seen in the direction orthogonal to the word line or the direction of bit line so as to form a channel crossing orthgonally the word line 3. The drain diffusion layers 2 of each memory cell pair may be deviated in the same direction with respect to the source diffusion layer 17. However, when the drain diffusion layers 2 are deviated in opposite directions as shown in the drawings, the memory cell pairs can be disposed most densely because of the positional relationship of the storage electrodes 7 as shown in FIG. 7.

Figure 8:
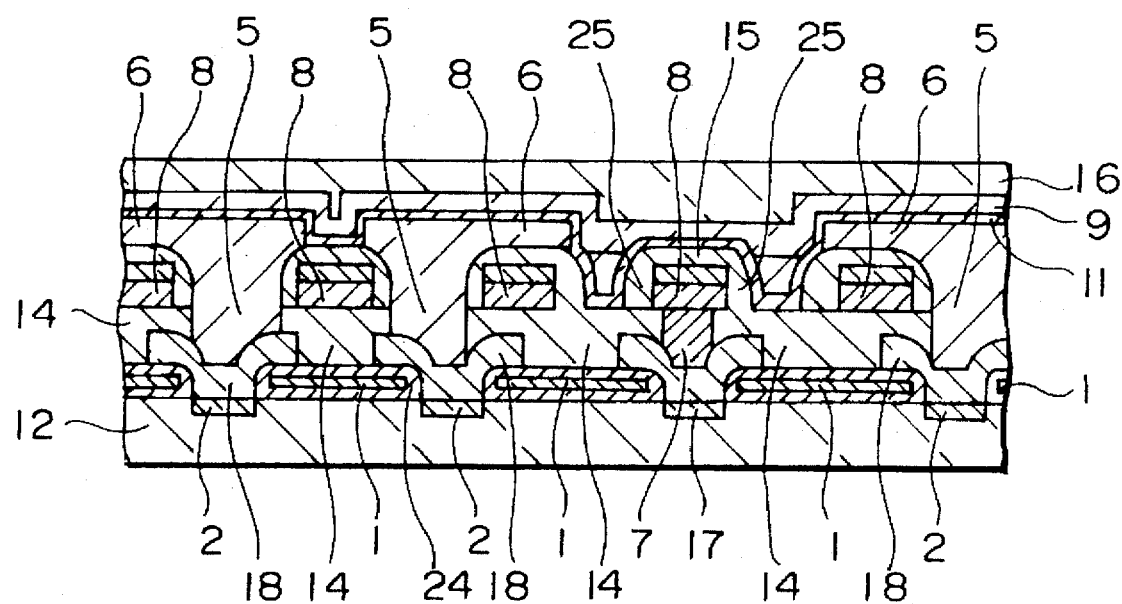
FIG. 8 is a sectional view taken along a line VIII—VIII of FIG. 7.
Figure 9:
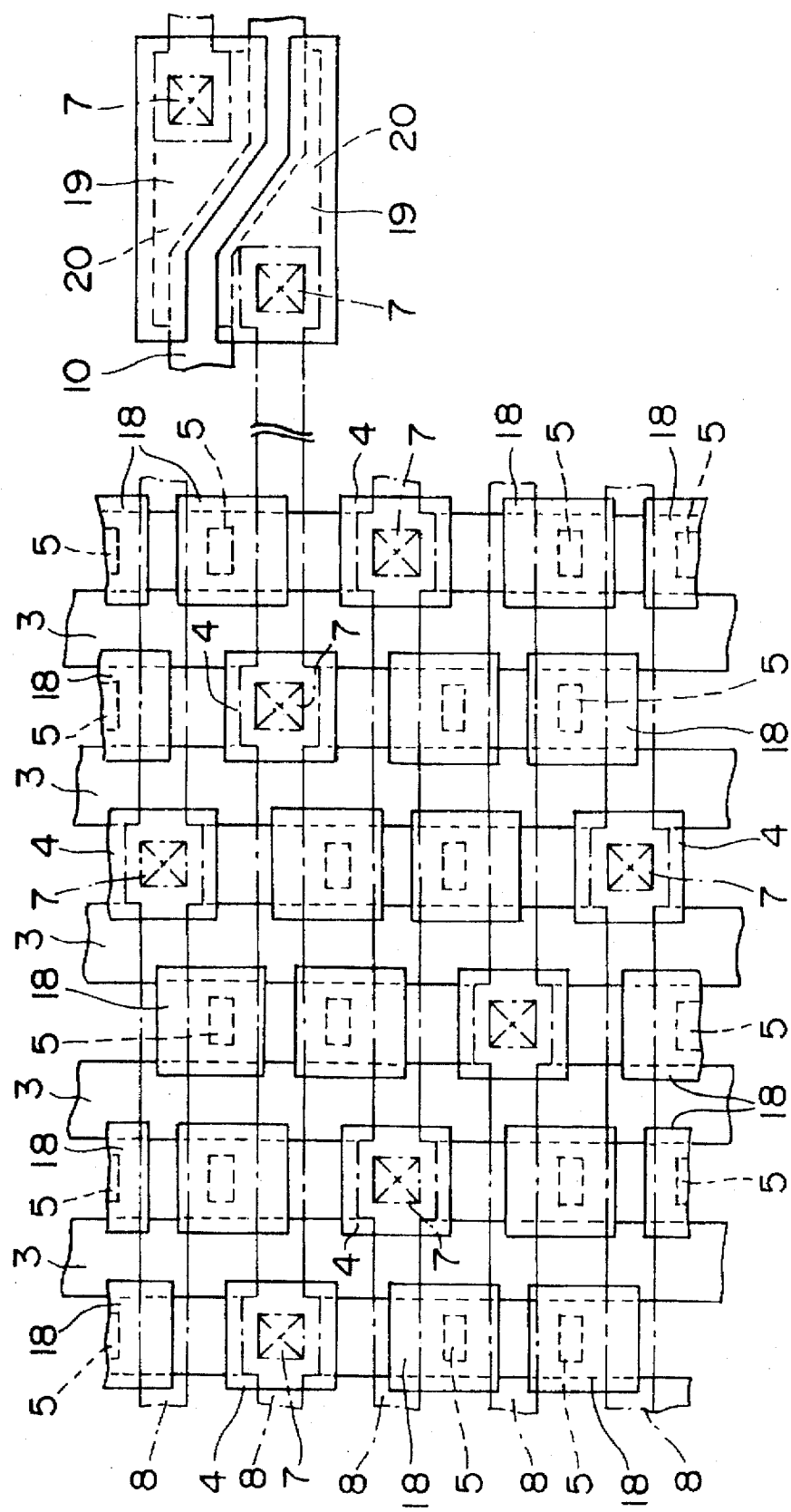
FIG. 9 is a plan view showing particularly distinctly the arrangement of a pad polycrystalline silicon film in the embodiment shown in FIG. 7.
Figure 10:
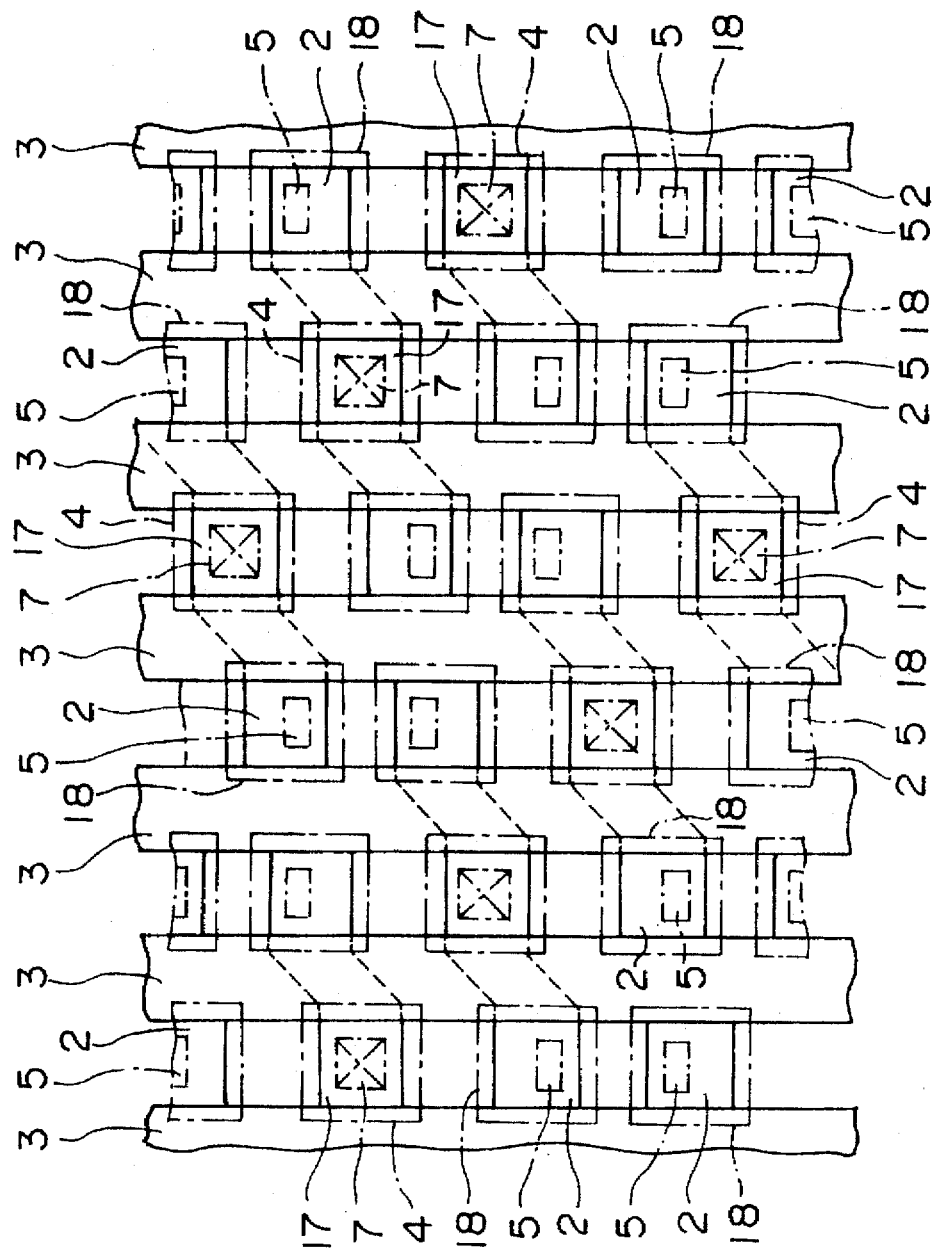
FIG. 10 is a plan view showing particularly distinctly the arrangement of memory cells in the embodiment shown in FIG. 7.

In the second embodiment, the pad polycrystalline silicon films 4 are disposed as shown in FIGS. 9 and 10 such that two pad polycrystalline silicon films 18 are disposed between adjacent two of the pad polycrystalline silicon films 4 in the direction along the word line 3, while four word lines 3 are disposed between adjacent two of the pad polycrystalline silicon films 4 in the direction along the bit line 8. Consequently, the bit contacts 7 are arranged in the cell array portion, as shown in FIGS. 7 and 9, such that four word lines are disposed between adjacent two of the bit contacts in the direction along the bit line 8 and three bit lines 8 are disposed between adjacent two of the bit contacts in the direction along the word line 3. Incidentally, the pad polycrystalline silicon film 4 and the pad polycrystalline silicon film 18 may be either the same or different in shape. In the case of the latter, it is desired that in each memory cell pair, the pad polycrystalline silicon film 18, which is in contact with the drain diffusion layer 2, is formed in a shape somewhat greater in the direction of the word line so that it greatly extends over the field shield element isolation structure as shown in FIG. 8 thereby obtaining its reliable connection with the storage contact 5.

The second embodiment, too, can obtain the same effects as those of the first embodiment regarding miniaturization of the memory cell array, a higher density in integration thereof, the increase of the effective surface area of the capacitor and the reduced interference noise between the bit lines.

Next, a method of making the semiconductor memory device according to the second embodiment will be explained with reference to FIGS. 2 and 11A through 11H.

Figure 11D:
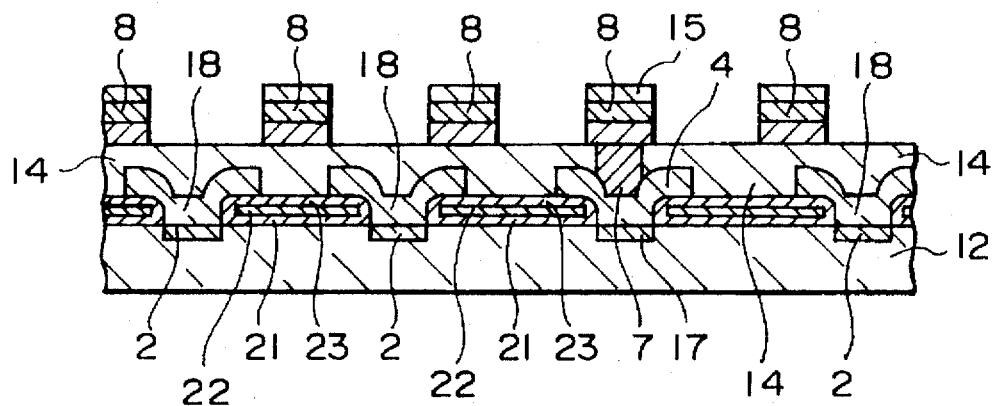
Figure 11E:
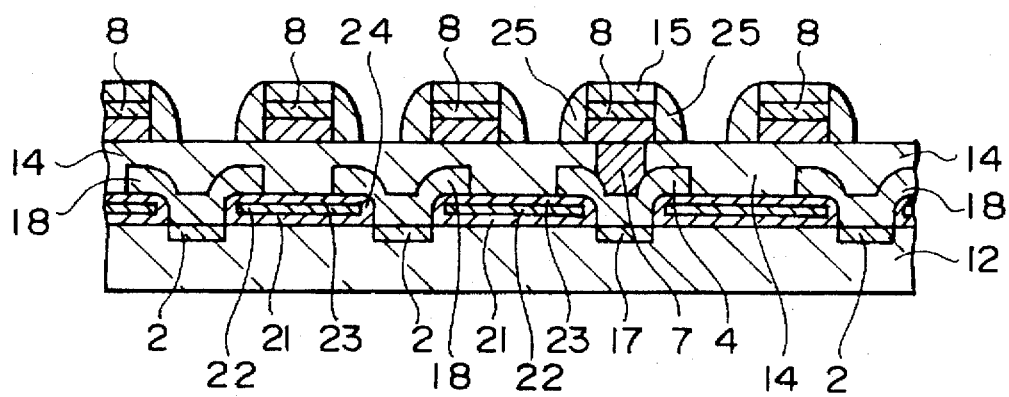
Figure 11F:
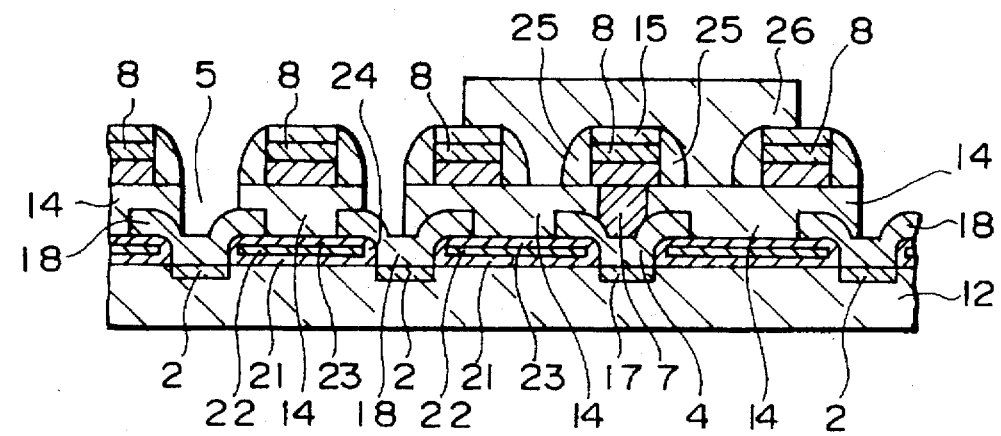
Figure 11G:
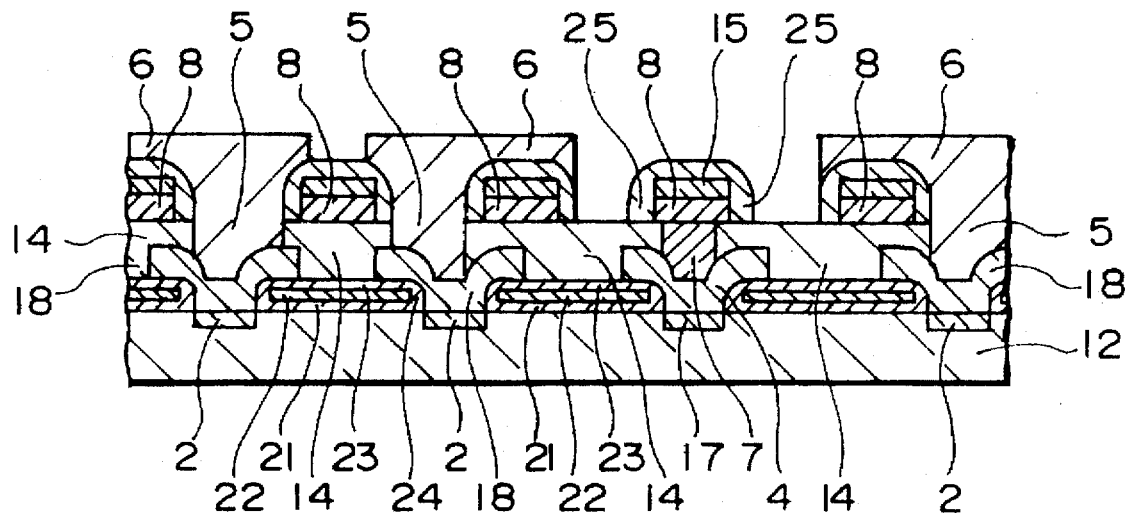
Figure 11H:
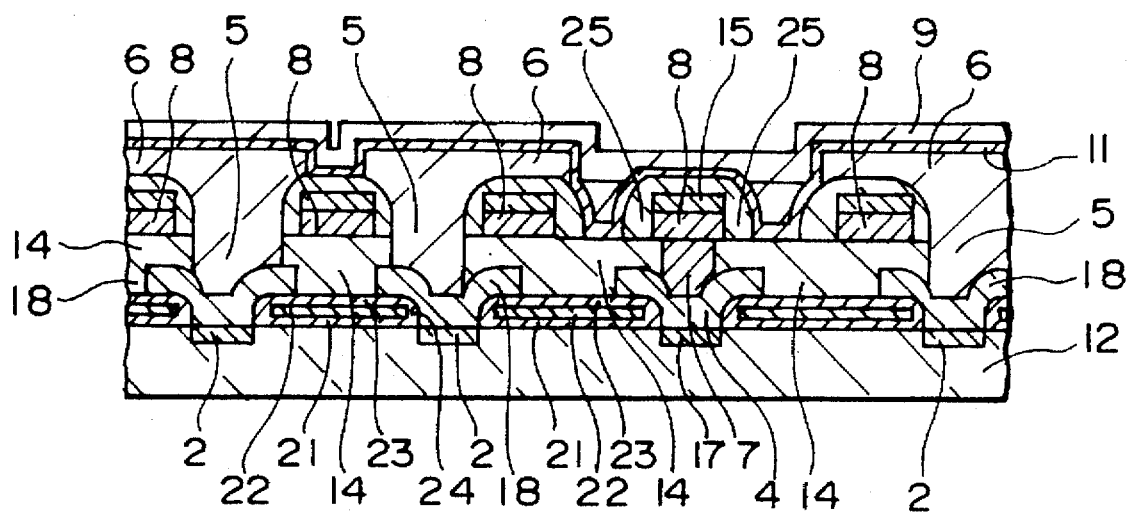
Figure 12:
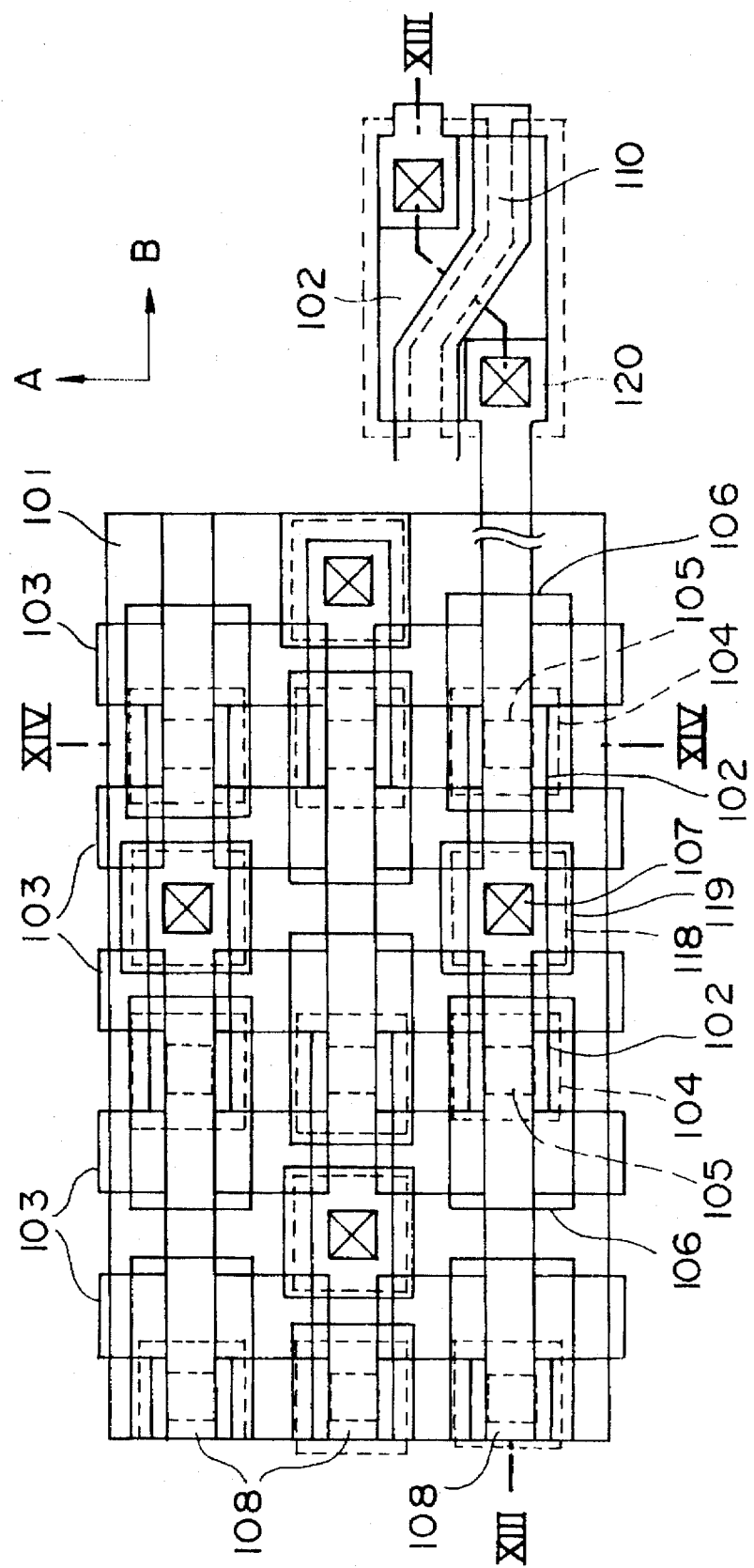
FIG. 12 is a plan view showing the structure of a DRAM according to the prior art.
Figure 13:
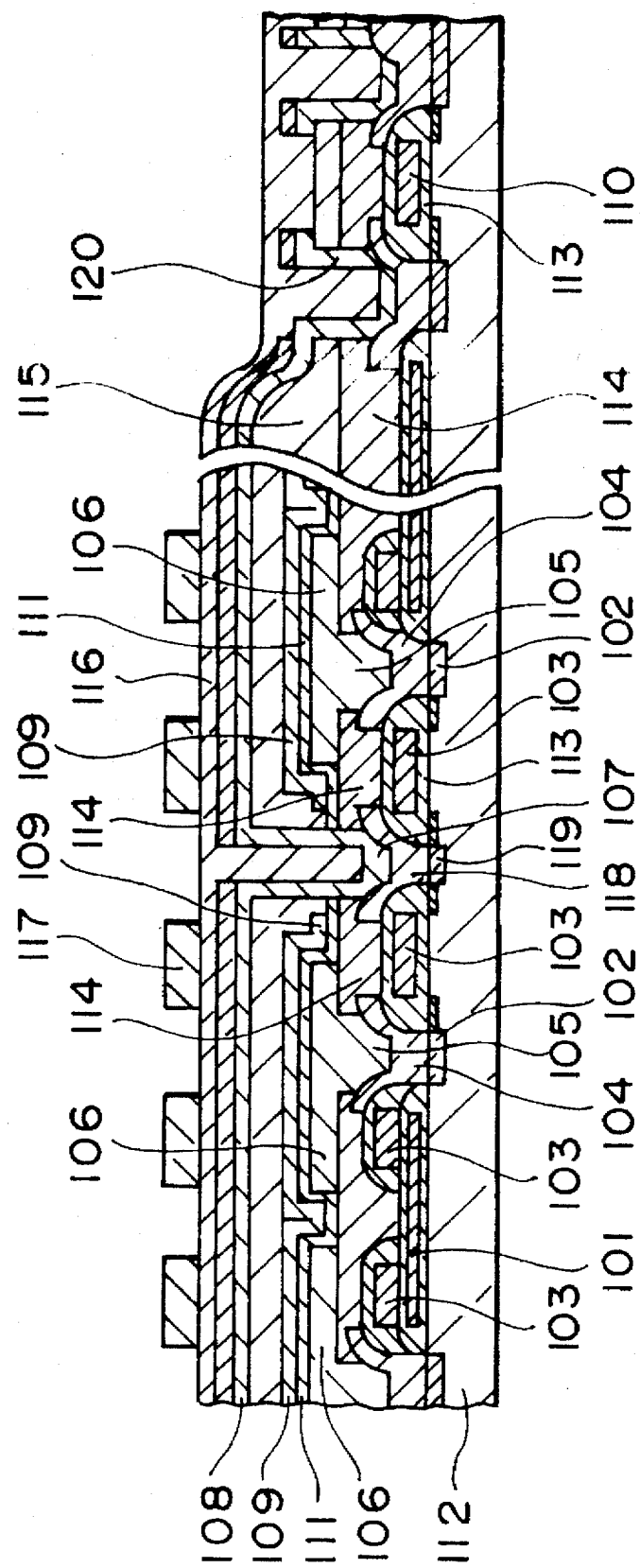
FIG. 13 is a sectional view taken along a line XIII—XIII of FIG. 12.
Figure 14:
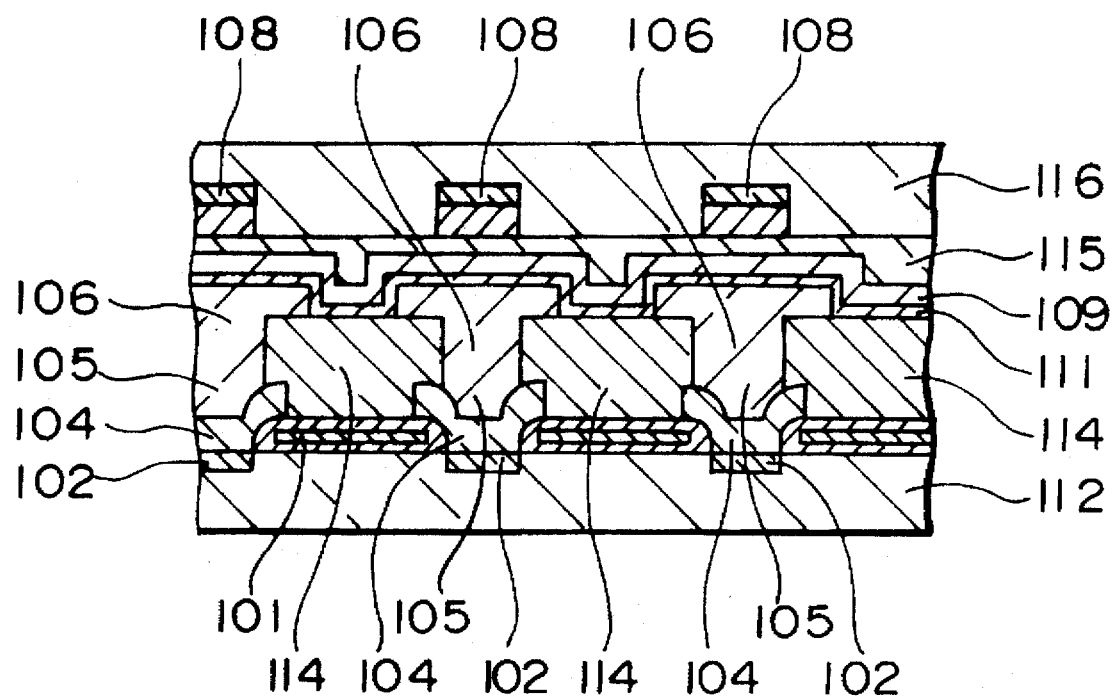
FIG. 14 is a sectional view taken along a line XIV—XIV of FIG. 12.

As described above, the second embodiment is different from the first embodiment only in the positional relationship of each drain diffusion layer 2 with respect to the source diffusion layer 17 in each memory cell pair. Therefore, the explanation of the method of the first embodiment described with reference to FIGS. 2 and 6A through 6H is fundamentally applied to the method of the second embodiment. That is, the explanation of the method of the second embodiment is given by substituting FIGS. 6A through 6H by FIGS. 11A through 11H in the explanation of the method of the first embodiment, except that the second embodiment is different from the first embodiment in the following points as seen from comparison between the respective drawings.

a) In the second embodiment, as shown in FIG. 11A, a pad oxide film 21, a polycrystalline silicon film 22 and a cap oxide film 23 are successively formed on a P-type silicon substrate and then this 3-layer lamination is patterned so as to leave its portion disposed at the element isolation region thereby defining element regions surrounded by the element isolation region. In this case, the 3-layer lamination is specifically patterned so as to be adapted to obtain a pattern of the memory cell pair as shown in FIG. 7. That is, the 3-layer lamination is patterned so as to form, in each element region, a center gap portion where the common source diffusion layer of each memory cell pair is to be formed just below the bit line 8 and two side gap portions at both sides of the center gap portion where two drain diffusion layers of the memory cell pair are to be formed. The side gap portions are positioned each corresponding to a space between adjacent two bit lines and deviated in opposite directions along the word line with respect to the center gap portion. In contrast, in the first embodiment, the two drain diffusion layers of each memory cell pair are so formed as to be positioned just below the bit line 8.

b) In the second embodiment, the shape of the pad polycrystalline silicon film 18 formed at the side gap portion is symmetric with respect to the gap portion (immediately on which the bit line 8 is formed) as shown in FIG. 11C. In contrast, in the first embodiment, the pad polycrystalline silicon film 18 extends asymmetrically in the column direction with respect to the gap portion (i.e., more greatly on the left side in the drawing, that is, in the direction away from the common impurity diffusion layer 17 of an adjacent memory cell pair than on the right side, that is, in the direction closer to the common impurity diffusion layer 17). The width of the pad polycrystalline silicon film 4 or 18 in the row direction (bit line direction) is substantially equal to the gap between two adjacent word lines 3 in any of the first and second embodiments as shown in FIG. 2.

c) In the second embodiment, each bit line 8 is formed such that each drain diffusion layer 2 is positioned in a surface region of the substrate corresponding to the gap between two bit lines 8 as shown in FIG. 11D. In contrast, in the first embodiment, the bit line 8 is formed such that it extends immediately above the drain diffusion layer 2 as shown in FIG. 6D.

According to the second embodiment, the bit line is formed in a layer lower than the storage electrode or the cell plate electrode of each memory cell. Therefore, even when the cell capacitance is increased by increasing the height of the storage electrode or forming the storage electrode in a three-dimensional configuration, the aspect ratio of the bit contact at the cell array portion does not become greater and no step exists in the bit line at its portion between the cell array portion and the peripheral portion. Consequently, the poor dimensional accuracy resulting from resolution defect of the bit line does not occur.

In the second embodiment, the diffusion layers of each memory cell are formed at positions deviated each other in the word line direction for locating the storage contact of the memory cell at a position between the bit lines. For this reason, it is not necessary to use any specific element or member other than the pad polycrystalline silicon film which is used as a source of the impurity to be differed into the substrate, for example.

I claim:

1. A semiconductor memory device comprising:

a field shield element isolation structure for defining a plurality of element regions electrically isolated from one another;

a plurality of memory cells disposed in a matrix of rows and columns, each memory cell including a transistor having a gate electrode and two impurity diffusion layers and a capacitor electrically connected to one of said two impurity diffusion layers;

a plurality of bit lines extending in a row direction;

a plurality of word lines extending in a column direction;

a plurality of memory cell pairs, each memory cell pair being formed in one of the plurality of element regions and including adjacent two of the memory cells disposed in the row direction, each of the transitors of the two memory cells constituting the memory cell pair having two impurity diffusion layers, one of which is common to both the transistors and connected to one of the bit lines disposed immediately above the one impurity diffusion layer and extending in the row direction through a first pad polycrystalline silicon film;

a second pad polycrystalline silicon film formed on the other impurity diffusion layer of each of the transitors of the memory cells constituting each memory cell pair and extending over a portion of the element isolation structure defining one of the element regions in which the memory cell pair is formed and adjacent in the column direction to the one element region; and a lower electrode of the capacitor of each of the memory cells constituting each memory cell pair formed on and insulated from the one bit line to which the one impurity diffusion layer is connected and connected to the other impurity diffusion layer through the second pad polycrystalline silicon film.

2. A semiconductor memory device according to claim 1, wherein the two second pad polycrystalline silicon films formed on the others of said impurity diffusion layers of said transistors, respectively, of said two memory cells in each of said memory cell pairs extend in opposite directions along the column direction with respect to a line connecting the other impurity diffusion layers of said two transistors connected to said pad polycrystalline silicon films.

3. A semiconductor memory device according to claim 2, wherein said plurality of memory cell pairs are disposed on the substrate such that two first pad polycrystalline silicon films provided to adjacent two of said memory cell pairs disposed along the column direction, respectively, are aligned in the column direction with two second pad polycrystalline silicon films provided to other memory cell pairs, respectively, disposed between said two first pad polycrystalline silicon films, and other two first pad polycrystalline silicon films provided to adjacent two of said memory cell pairs disposed along the row direction, respectively, are disposed with four word lines between said other two first pad polycrystalline silicon films.

4. A semiconductor memory device comprising:

a field shield element isolation structure for defining a plurality of element regions electrically isolated from each other;

a plurality of memory cells disposed in a matrix of rows and columns, each of said memory cells including a transistor having two impurity diffusion layers and a gate electrode and a capacitor;

a plurality of bit lines extending in a row direction;

a plurality of word lines extending in a column direction;

a plurality of memory cell pairs, each memory cell pair being formed in one of the plurality of element regions and including adjacent two of the memory cells disposed in the row direction, each of the transistors of the two memory cells constituting the memory cell pair having two impurity diffusion layers, one of said two impurity diffusion layers being common to both the transistors and connected to one of the bit lines disposed immediately above the one impurity diffusion layer and extending in the row direction through a first pad polycrystalline silicon film;

the other of said two diffusion layers being formed at a position deviated in the column direction with respect to said one bit line extending over said one impurity diffusion layer so that said other impurity diffusion layer is positioned immediately below a gap between adjacent two of said bit lines; and a lower electrode of the capacitor of each of the memory cells constituting each memory cell pair formed on and insulated from said one bit line to which the one impurity diffusion layer common to the transistors of said memory cell pair is connected and connected to the other impurity diffusion layer of the transitor of the memory cell through a second pad polycrystalline silicon film.

5. A semiconductor memory device according to claim 4, wherein the direction of deviation of the other impurity diffusion layer of one of said transistors of said memory cell in each memory cell pair is opposite to the direction of deviation of the other impurity diffusion layer of the other of said transistors.

6. A semiconductor memory device according to claim 4, further comprising a first pad polycrystalline silicon film through which said impurity diffusion layer common to both of said transistors is connected to said one bit line; and a second polycrystalline silicon film through which said lower electrode of said capacitor is connected to the other of said impurity diffusion layers.

7. A semiconductor memory device according to claim 6, wherein said plurality of memory cell pairs are disposed on the substrate such that two first pad polycrystalline silicon films provided to adjacent two of said memory cell pairs disposed along the column direction, respectively, are aligned in the column direction with two second pad polycrystalline silicon films provided to other memory cell pairs, respectively, disposed between said two first pad polycrystalline silicon films, and other two first pad polycrystalline silicon films provided to adjacent two of said memory cell pairs disposed along the row direction, respectively, are disposed with four word lines between said other two first pad polycrystalline silicon films.

* * * * *

UNITED STATES PATENT AND TRADEMARK OFFICE
CERTIFICATE OF CORRECTION

PATENT NO. : 5,686,746
DATED : November 11, 1997
INVENTOR(S): Iwasa

It is certified that error appears in the above-identified patent and that said Letters Patent is hereby corrected as shown below:

[30] Foreign application Priority Data

[Mar. 31, 1994] should be ---Aug. 31, 1994---.

Signed and Sealed this

Tenth Day of February, 1998

Attest:

BRUCE LEHMAN

Attesting Officer        Commissioner of Patents and Trademarks